(12) United States Patent
Kanematsu

(10) Patent No.: US 10,333,529 B1
(45) Date of Patent: Jun. 25, 2019

(54) METHOD OF FORMING A CONVERSION CIRCUIT AND STRUCTURE THEREFOR

(71) Applicant: SEMICONDUCTOR COMPONENTS INDUSTRIES, LLC, Phoenix, AZ (US)

(72) Inventor: Masayuki Kanematsu, Hashima (JP)

(73) Assignee: SEMICONDUCTOR COMPONENTS INDUSTRIES, LLC, Pheonix, AZ (US)

( * ) Notice: Subject to any disclaimer, the term of this patent is extended or adjusted under 35 U.S.C. 154(b) by 0 days.

(21) Appl. No.: 16/111,880

(22) Filed: Aug. 24, 2018

(51) Int. Cl.
*H03L 7/06* (2006.01)
*H03L 7/093* (2006.01)

(52) U.S. Cl.
CPC .................................. *H03L 7/093* (2013.01)

(58) Field of Classification Search
CPC ..... H03L 7/093; H03L 7/0895; H03L 7/0896; H03L 7/0891; H03L 7/18; H03L 7/087; H03L 5/132; G06F 1/04
See application file for complete search history.

(56) References Cited

U.S. PATENT DOCUMENTS

| | | | |
|---|---|---|---|
| 2002/0051509 A1* | 5/2002 | Lindner | H03L 7/0891 375/376 |
| 2004/0080035 A1 | 4/2004 | Chen et al. | |
| 2005/0057313 A1 | 3/2005 | Keaveney et al. | |
| 2005/0248413 A1 | 11/2005 | Zhu et al. | |
| 2006/0055436 A1 | 3/2006 | Gaboriau et al. | |
| 2009/0051421 A1 | 2/2009 | Mathe | |
| 2010/0219864 A1* | 9/2010 | Farhat | G11C 27/026 327/96 |

FOREIGN PATENT DOCUMENTS

| | | |
|---|---|---|
| JP | 03-250911 | 11/1991 |
| JP | 2000-022532 | 1/2000 |
| JP | 2008-104197 | 5/2008 |
| JP | 2016-063442 | 4/2016 |
| JP | 2017-157939 | 9/2017 |

* cited by examiner

*Primary Examiner* — Long Nguyen
(74) *Attorney, Agent, or Firm* — Robert F. Hightower

(57) ABSTRACT

In one embodiment, a differential to single ended conversion circuit is configured to convert a differential signal to a single ended signal without using an operational amplifier and without using a current source to charge a capacitor.

20 Claims, 3 Drawing Sheets

METHOD OF FORMING A CONVERSION CIRCUIT AND STRUCTURE THEREFOR

BACKGROUND OF THE INVENTION

The present invention relates, in general, to electronics, and more particularly, to semiconductors, structures thereof, and methods of forming semiconductor devices.

In the past, the electronics industry utilized various circuits and methods to form phase lock loop (PLL) systems. The PLL system usually included a differential loop filter providing a differential signal as an output. The system may have also included a differential amplifier that converted the differential signal to a single ended signal for use within the system. The differential amplifier may have also amplified the differential signal while forming the single ended signal.

The differential amplifier often was formed on a semiconductor device along with other portions of the PLL. However, the differential amplifier occupied a large area of the of the semiconductor die on which the semiconductor device was formed. The large area resulted in a higher cost for the semiconductor device.

Accordingly, it is desirable to have a differential to singled signal conversion device for a PLL that has a smaller area and/or that occupies a smaller area of the semiconductor die.

Figure 1:
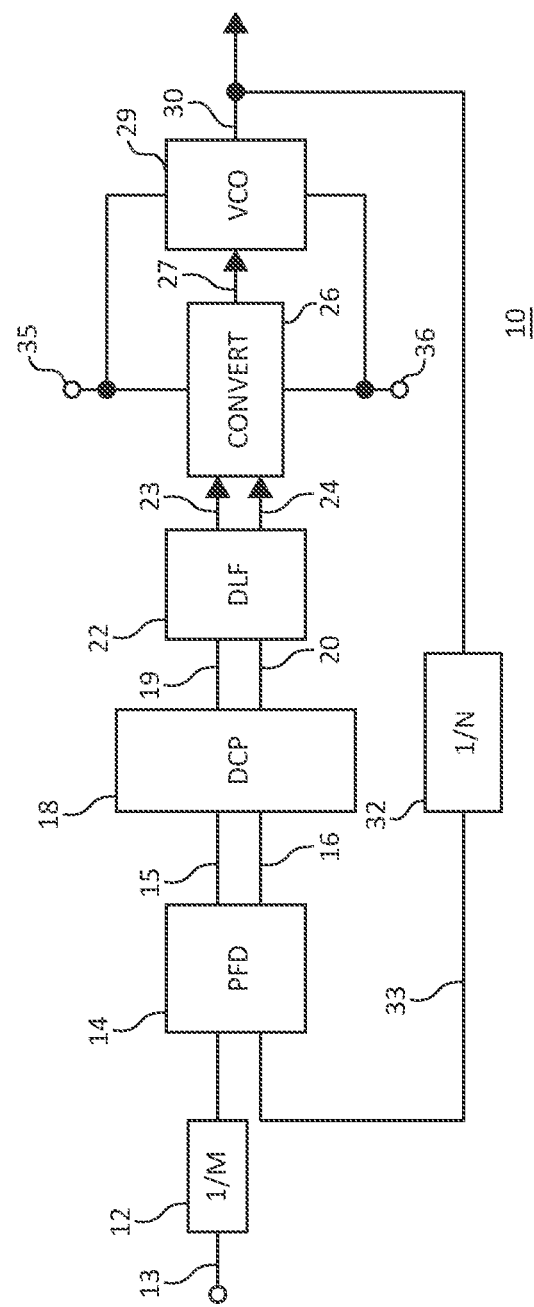
FIG. 1 schematically illustrates a phase lock loop (PLL) system that includes a differential-to-single ended signal conversion circuit in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures, or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

The embodiments illustrated and described hereinafter suitably may have embodiments and/or may be practiced in the absence of any element which is not specifically disclosed herein.

DETAILED DESCRIPTION OF THE DRAWINGS

FIG. 1 schematically illustrates a phase lock loop (PLL) system 10 that includes a differential-to-single ended signal conversion circuit or conversion circuit or convert circuit 26. System 10 includes a voltage controlled oscillator circuit or VCO 29 that forms an oscillating signal 30 on an output of VCO 29. A frequency divider circuit or divider circuit 32 divides the frequency of signal 30 to form a divided signal 33 that is representative of signal 30 but is divided by a divider ratio (1/N) set by circuit 32. Thus, divided signal 33 has a frequency that is a sub-multiple of the frequency of signal 30. System 10 also includes a phase/frequency detection circuit or PFD circuit 14 that receives a source signal 13 on a first input of circuit 14. In some embodiments, system 10 may include an optional divider circuit 12 that divides (1/M) source signal 13 prior to PFD circuit 14 receiving the source signal. Circuit 14 also receives divided signal 33 on a second input, and generates pulses indicating that the frequency of signal 30 should increase, or decrease. PFD circuit 14 compares the phase of source signal 13 with that of divided signal 33, and forms the up pulses on an output 15 and forms the down pulses on an output 16. In an embodiment, the up-pulses and down-pulses may be voltage pulses. A differential charge pump circuit or DCP circuit 18 receives the voltage pulses and converts the voltage pulses to current pulses. For example, pulses on output 19 may indicate that the frequency of VCO 29 should increase and pulses on output 20 may indicate that the frequency of VCO 29 should decrease.

A differential loop filter circuit or DLF 22 may be configured to filter the current pulses and convert the current pulses to voltages. For example, DLF 22 may include one or more low pass filters that filter the pulses to form a more slowly changing signal. The low pass filter function removes high frequency components of the signals received from outputs 19 and 20 which minimizes spurious changes to the frequency of signal 30. DLF 22 may have an output 23 having an analog signal that increases in value in response to current pulses received from output 19 of DCP circuit 18 and may decrease in value in response to pulses received from output 20 of DCP circuit 18. DLF 22 may also have an output 24 having an analog signal that may increase in value in response to receiving current pulses from output 20 of DCP 18 and that may decrease in value in response to receiving current pulses from output 19 of DCP 18. Thus, an embodiment of DLF 22 may include that outputs 23 and 24 may form a differential signal that indicates if the frequency of VCO 29 should increase or decrease. Those skilled in the art will understand that a differential signal is formed as two complimentary signals that are transmitted on two separate conductors. The information in the two signals is the difference between the values of the voltage or current on the two conductors instead of the difference between the potential on the conductor and a ground or common reference potential.

Convert circuit 26 receives the differential signal from outputs 23-24 and forms a single ended signal 27 having a value that is representative of the differential value of the signals on outputs 23-24. The information in signal 27 is the value of the signal, such as a current value or voltage value, related to a common return such as for example a ground reference. Signal 27 may be used to control VCO 29 to either increase or decrease the frequency of signal 30. In an embodiment, circuit 26 does not include a current source used to charge a capacitor and does not include a current source of any type. An embodiment of circuit 26 also does not include a differential amplifier or any type of operational amplifier, including an amplifier configured as an integrator or a summing element. Circuit 26 may have a transfer function that may affect the operation of DLF 22 or may affect the stability of system 10. Thus, the transfer function should be considered when designing DLF 22. An embodiment of circuit 26 may be composed of switched capacitors.

Circuit 26 may receive operating power that is supplied between a power terminal 35 and a common return terminal 36. An embodiment of VCO 29 may also be connected to receive the operating power that is supplied between terminals 35-36. The voltage applied between terminals 35 and 36 may sometimes be referred to as the power supply voltage, or the operating voltage, or Vcc, or Vdd. The common return voltage on terminal 36 typically is a low potential and provides a return for the voltage supplied to terminal 35. The potential applied to terminal 36 may be referred to as ground, or a ground potential, or Vss for example. For simplicity of explanation, the potential applied between terminals 35-36 will be referred to as the operating voltage and abbreviated as Vd. In an embodiment, the operating voltage (Vd) applied between terminals 35 and 36 may also be used as the operating voltage for operating PFD 14, DCP 18, and DLF 22.

Figure 2:
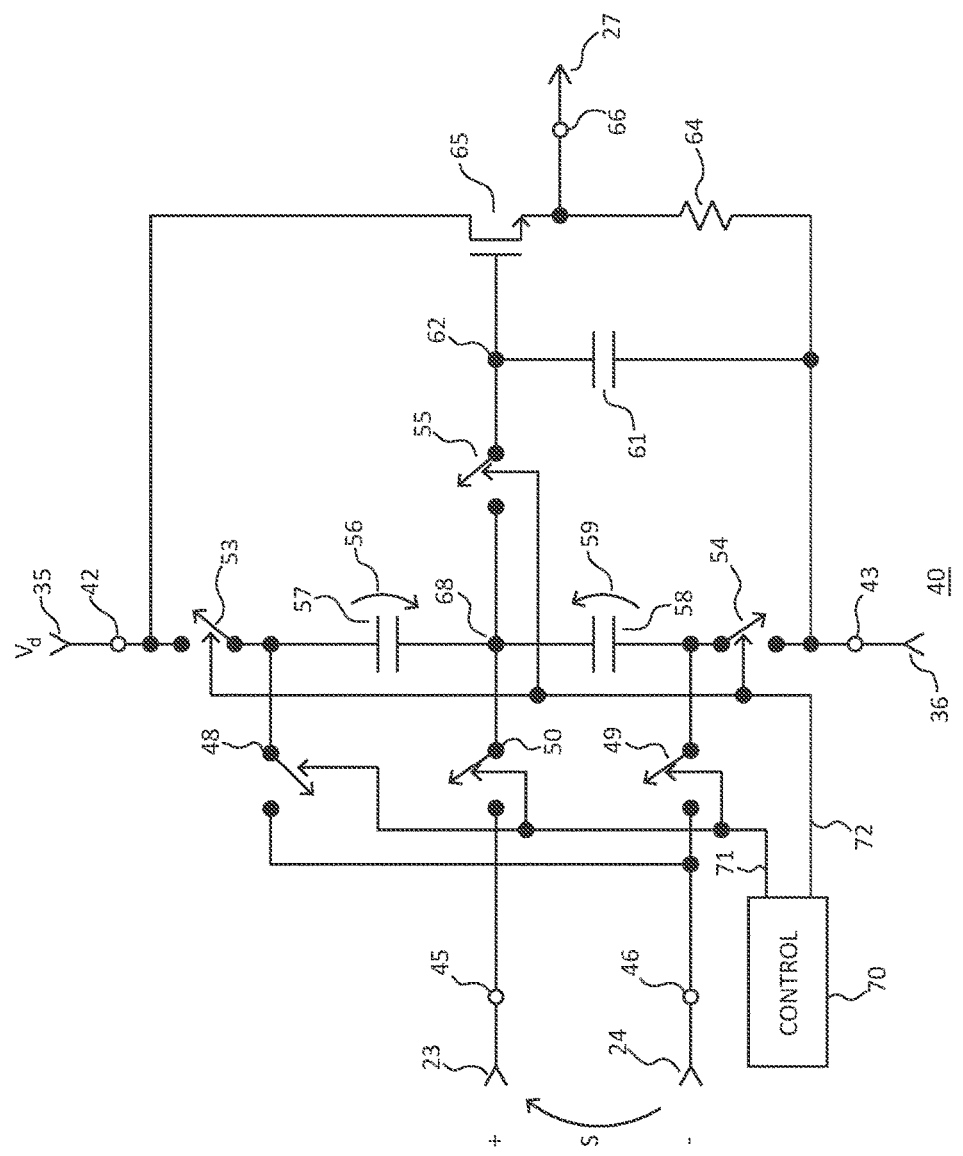
FIG. 2 schematically illustrates an example of an embodiment of a differential signal-to-single ended signal conversion circuit that may have an embodiment that is an alternate embodiment of the differential-to-single ended signal conversion circuit of FIG. 1 in accordance with the present invention.

FIG. 2 schematically illustrates an example of an embodiment of a differential signal-to-single ended signal conversion circuit 40 that may have an embodiment that is an alternate embodiment of circuit 26 of FIG. 1. Circuit 40 includes a differential input that includes inputs 45 and 46 that are configured to receive a differential signal. An embodiment may include that inputs 45-46 are configured to receive the differential signal from outputs 23-24 of DLF 22. The two signals are illustrated in FIG. 2 as signal S+ and signal S−. The value of the signal S+ relative to signal S− is referred to as a value S and is illustrated by an arrow representing a voltage of signal S wherein the arrowhead has a positive value relative to signal S−.

Circuit 40 includes an output 66 that provides single ended signal 27 that has a value that is representative of the differential value of the differential signal. A power input terminal 42 of circuit 40 typically is connected to terminal 35 and a common return terminal 43 typically is connected to terminal 36. Thus, operating voltage Vd is applied between terminals 42 and 43. Circuit 40 also includes conversion capacitors 57 and 58 that each have a first terminal commonly connected to a conversion node 68, to a first terminal of an output switch 55, and to a first terminal of an input switch 50. A second terminal of switch 50 is connected to input 45. A second terminal of capacitor 57 is commonly connected to a first terminal of a switch 53 and to a first terminal of an input switch 48. A second terminal of switch 48 is connected to input 46, and a second terminal of switch 53 is connected to terminal 42. A second terminal of capacitor 58 is commonly connected to a first terminal of a switch 54 and to a first terminal of an input switch 49. A second terminal of switch 49 is connected to input 46, and a second terminal of switch 54 is connected to terminal 43. Input switch 50 is configured to selectively couple input 45 to conversion node 68, thus, to the first terminal of capacitors 57-58. Input switch 48 is configured to selectively couple the second terminal of capacitor 57 to input 46, and input switch 49 is configured to selectively couple input 46 to the second terminal of capacitor 58. Output switch 55 is configured to selectively couple conversion node 68 to an output node 62 and to a capacitor 61 in order to store the value of the single ended signal on capacitor 61. Thus, a second terminal of switch 55 is connected to node 62.

A control circuit 70 of circuit 40 is configured to selectively enable or close switches 48-50 during a time that switches 53-55 are disabled or open in order to selectively charge each of capacitors 57 and 58 to the value S of the differential signal received between inputs 45 and 46. For example, circuit 70 may be configured to assert signal 71 and negate signal 72. Enabling switches 48-50 while switches 53-55 are disabled, charges each of capacitors 57-58 to the value S as illustrated by arrows 56 and 59. Note that the plate of each of capacitors 57 and 58 that is connected to node 68 has a positive potential and the opposite plate has a negative potential as illustrated by arrows 56 and 59. Control circuit 70 is configured to thereafter disable switches 48-50 while switches 53-55 remain disabled. For example, circuit 70 may negate signal 71 and keep signal 72 negated.

Controller 70 is configured to subsequently enable switches 53-55 while switches 48-50 are disabled. For example, controller 70 may keep signal 71 negated and may assert signal 72. Enabling or closing switches 53-54 connects capacitors 57-58 in series with voltage Vd. Because capacitors connected in series function as a voltage divider, a voltage approximately equal to one half the value of voltage Vd is combined with the voltage S that is already stored on capacitors 57-58. Since switch 53 connects the negatively charged plate of capacitor 57 to voltage Vd, the voltage stored on capacitor 57 in the direction illustrated by arrow 56 becomes the voltage S minus one half of the voltage Vd (S−0.5Vd). However, the positively charged plate of capacitor 58 receives the voltage so that capacitor 58 is charged, in the direction of arrow 59, to the value of voltage S plus one half of voltage Vd (S+0.5Vd). The voltage on conversion node 68, relative to the voltage on terminal 43, is the same as the voltage stored on capacitor 58. Because switch 55 is also enabled, the voltage of capacitor 58 (S+0.5Vd) is stored on capacitor 61 and applied to output node 62. Consequently, single ended signal 27 has the value of signal S that varies around a common mode voltage of approximately 0.5Vd.

Subsequently, switches 53-55 are disabled so that the voltage on output node 62 remains at the value (S+0.5Vd). Thereafter, switches 48-50 may again be enabled to store the value S of the differential signal on capacitors 57-58. Since switch 55 remains open, charging capacitors 57-58 does not affect the voltage on output node 62.

In some embodiments, output node 62 may be used as the output to form signal 27. In other embodiments, circuit 40 may be include an optional buffer, that receives the signal from output node 62 and forms the signal on output 27 to be representative thereof. Such a buffer prevents loading from affecting the value of the single ended signal. In some embodiments, the buffer may be a follower circuit such as for example a source follower. An example of an embodiment of a source follower may include a transistor 65 and a resistor 64. An embodiment may include that a source of transistor 65 is connected to output 66 and to a first terminal of resistor 64 which has a second terminal connected to terminal 43. A drain of transistor 65 may be connected to terminal 42, and a gate of transistor 65 may be connected to node 62.

Those skilled in the art will appreciate that the voltage between terminals 42 and 43 may be other voltages, such as for example a reference voltage, instead of the operating voltage or supply voltage, as long as the sum of approximately one half of the value of the voltage plus the value S is less than the value of the power supply or operating voltage.

Figure 3:
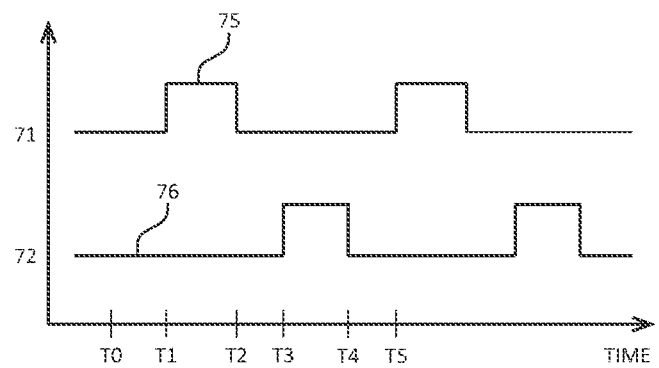
FIG. 3 is a graph having plots that illustrate an example of an embodiment of some control signals that may be formed by the differential-to-single ended signal conversion circuit of FIG. 2 in accordance with the present invention.

FIG. 3 is a graph having plots that illustrate an example of an embodiment of control signals 71 and 72 formed by controller 70. The abscissa indicates time and the ordinate indicates increasing value the illustrated signals. A plot 75 illustrates the value of signal 71 and a plot 76 illustrates the value of signal 72. Assume that at a time T0 both signals 71 and 72 are negated such that switches 48-50 and 53-55 are all disabled or open. Any time T1, controller 70 is configured to assert signal 71 to enable or close switches 48-50 while signal 72 remains negated such that switches 53-55 remain disabled. Thus, capacitors 57-58 are charged to the value S of the signal received between inputs 45-46. At a time T2, controller 70 is configured to negate signal 71 to disable switches 48-50 while signal 72 remains negated. Subsequently, at a time T3 controller 70 is configured to assert signal 72 to enable switches 53-55 to connect capacitors 57-58 in series with voltage Vd. Note that controller 70 is configured to leave an interval between times T2 and T3 where switches 71 and 72 are both negated to ensure that switches 48-50 are completely disabled prior to enabling switches 53-55. Subsequently, at a time 14 controller 70 negates signal 72 to disable switches 53-55. Thereafter, at a time T5 the cycle begins again by asserting signal 71. Note that there is an interval between T4 and T5 in which both control signals 71 and 72 are negated such that switches 48-50 and 53-55 are all disabled. The width of the interval between times T1 and T2 depends on the value of S and the capacitance of capacitors 57-58. The interval between times T3 and T4 also depends on the capacitance of capacitors 58 and 61. An embodiment of circuit 40 may include an oscillator to assist in forming signals 71 and 72.

In some embodiments, signal 72 may only control switches 53-54 and controller 70 may have a third control signal that enables switch 55 subsequently to disabling switches 53 and 54 and while switches 48-50 are also disabled.

Circuit 40 is configured to convert the differential signal received on inputs 45 and 46 to the single ended signal on output 27, or alternately on node 62. Circuit 40 is configured to be devoid of a current source to charge capacitors to different values. Circuit 40 is also configured to be devoid of a differential amplifier or an operational amplifier of any type, including an amplifier configured as an integrator or a summing element. Consequently, circuit 40 utilizes a smaller area on a semiconductor die than other types of conversion circuits that include amplifiers or current sources, thereby reducing the cost of the circuit and reducing the cost of the phase lock loop system that utilizes circuit 40.

Thus, circuit 40 is configured to receive a differential signal from a differential loop filter and to store a value of the differential signal. Circuit 40 is configured to thereafter add a fraction of a value of a reference signal to the stored signal to form the single ended signal.

Figure 4:
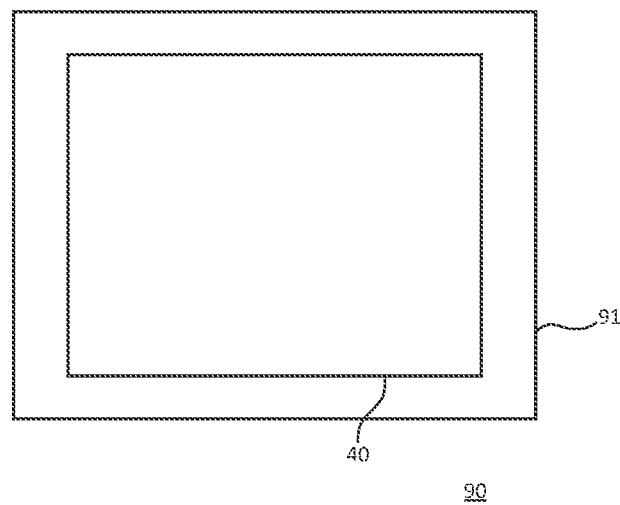
FIG. 4 illustrates an enlarged plan view of a semiconductor device that includes at least the differential-to-single ended signal conversion circuit of FIG. 1 or 2 in accordance with the present invention.

FIG. 4 illustrates an enlarged plan view of a portion of an embodiment of a semiconductor device or integrated circuit 90 that is formed on a semiconductor die 91. In an embodiment, circuits 26 or 40 may be formed on die 91. Any of circuits 14, 18, 22, and/or 20 may also be formed on die 91. Die 91 may also include other circuits that are not shown in FIG. 4 for simplicity of the drawing.

From all the foregoing, one skilled in the art will appreciate that a conversion circuit for a phase looked loop may comprise:

a first signal input, such as for example input 45, configured to receive a first portion of a differential signal from a differential loop filter, and a second signal input, such as for example input 46, configured to receive a second portion of the differential signal from the differential loop filter;

a power supply input, such as for example input 42;

a common return input, such as for example input 43;

a first capacitor having a first terminal coupled to a common mode node, such as for example node 59, the first capacitor having a second terminal;

a second capacitor, such as for example capacitor 58, having a first terminal coupled to the common mode node, the second capacitor having a second terminal;

a first switch, such as for example switch 48, having a first terminal coupled to the first signal input and having a second terminal coupled to the second terminal of the first capacitor;

a second switch, such as for example switch 49, having a first terminal coupled to the first signal input and having a second terminal coupled to the second terminal of the second capacitor;

a third switch, such as for example switch 50, having a first terminal coupled to the second signal input and having a second terminal coupled to the common mode node;

a fourth switch (53) having a first terminal coupled to the power supply input and having a second terminal coupled to the second terminal of the first capacitor;

a fifth switch having a first terminal coupled to the common return input and having a second switch coupled to the second terminal of the second capacitor;

a sixth switch, such as for example switch 55, having a first terminal coupled to the common mode node and a second terminal coupled to an output node, such as for example node 62, of the conversion circuit; and a control circuit, such as for example circuit 70, configured to enable the first switch the second switch and the third switch substantially simultaneously and configured to disable the first switch, the second switch, and the third switch substantially simultaneously, the control circuit configured to enable the fourth switch, the fifth switch, a and the sixth switch substantially simultaneously and to disable the fourth switch, the fifth switch, and the sixth switch substantially simultaneously wherein the control circuit enables the fourth switch, the fifth switch, and the sixth switch in a substantially non-overlapping manner relative to enablement of the first switch, the second switch, and the third switch.

Another example embodiment may also include an output capacitor, such as for example capacitor 61, coupled between the output node and the common return input.

An embodiment may also include a buffer circuit, such as for example circuit 65, coupled between the output node and an output, such as for example output 27, of the conversion circuit.

Another embodiment may include the buffer circuit may have an input, such as for example the transistor gate, coupled to the output node to receive a signal formed at the output node, and has an output coupled to the output of the conversion circuit.

In an embodiment, the buffer circuit includes a transistor, such as for example transistor 65, having a control electrode coupled to the output node, and a first current carrying electrode, such as for example the drain, coupled to the output of the conversion circuit.

An embodiment may include that the conversion circuit is devoid of an operational amplifier.

Another embodiment may include the conversion circuit is devoid of a current source.

Those skilled in the art will also appreciate that a method of forming a conversion circuit for a phase lock loop may comprise:

forming a first input, such as for example input 45, and a second input, such as for example input 46, to receive a differential signal from a differential loop filter;

forming a first conversion capacitor, such as for example capacitor 57, coupled to a second conversion capacitor, such as for example capacitor 58;

configuring the conversion circuit to selectively charge the first conversion capacitor and the second conversion capacitor to a value of the differential signal; and configuring the conversion circuit to thereafter selectively couple the first conversion capacitor and the second conversion capacitor in series, and selectively couple a reference voltage in parallel therewith.

Another embodiment of the method may also include commonly coupling the first conversion capacitor and the second conversion capacitor to a conversion node.

An embodiment may include commonly coupling a first terminal of the first conversion capacitor to the conversion node, and coupling a first terminal of the second conversion capacitor to the conversion node.

In an embodiment, the method may include configuring the conversion circuit to selectively couple the first conversion capacitor and the second conversion capacitor in parallel with the differential signal.

Another embodiment may include configuring the conversion circuit to selectively couple the first input to a first terminal of the first conversion capacitor and to a first terminal of the second conversion capacitor, and to selectively couple the second input to a second terminal of the first conversion capacitor and to a second terminal of the second conversion capacitor.

An embodiment may include electively couple the first conversion capacitor and the second conversion capacitor in series includes coupling a first terminal of the first conversion capacitor to a first terminal of the second conversion capacitor, selectively coupling the reference voltage to a second terminal of the first conversion capacitor, and selectively coupling a second terminal of the second conversion capacitor to a common return of the reference voltage.

The method may also have an embodiment which includes coupling a first switch, such as for example switch 50, between the first input and a conversion node, such as for example node 68, that is commonly coupled to a first terminal of the first conversion capacitor and a first terminal of the second conversion capacitor.

Another embodiment may also include coupling a second switch, such as for example switch 48, between the second input and a second terminal of the first conversion capacitor, and coupling a third switch, such as for example switch 49, between the second input and a second terminal of the second conversion capacitor.

An embodiment may also include coupling a fourth switch, such as for example switch 55, between the conversion node and an output of the conversion circuit.

An embodiment may also include coupling the fourth switch between the conversion node and a first terminal of an output.

Another embodiment may include coupling a fifth switch, such as for example switch 53, between the second terminal of the first conversion capacitor and the reference voltage.

Those skilled in the art will also understand that a method of forming a conversion circuit for converting a differential signal to a single ended signal for a phase locked loop may comprise:

providing inputs to receive a differential signal from a differential loop filter;

configuring the conversion circuit to store a value of the differential signal to form a stored signal; and configuring the conversion circuit to add a fraction of a value of a reference signal to the stored signal to form a single ended output signal.

Those skilled in the art will appreciate that a conversion circuit for a phase lock loop may comprise:

a first input and a second input, such as for example inputs 45 and 46, configured to receive a differential signal from a differential loop filter;

a first conversion capacitor, such as for example capacitor 57, coupled to a second conversion capacitor, such as for example capacitor 58;

configuring the conversion circuit to selectively charge the first conversion capacitor and the second conversion capacitor to a value of the differential signal; and configuring the conversion circuit to thereafter selectively couple the first conversion capacitor and the second conversion capacitor in series, and selectively couple a reference voltage in parallel therewith.

Another embodiment may include commonly coupling the first conversion capacitor and the second conversion capacitor to a conversion node.

An embodiment may include commonly coupling a first terminal of the first conversion capacitor to the conversion node, and coupling a first terminal of the second conversion capacitor to the conversion node.

In an embodiment, the conversion circuit may be configured to selectively couple the first conversion capacitor and the second conversion capacitor in parallel with the differential signal.

Another embodiment may include that the conversion circuit is configured to selectively couple the first input to a first terminal of the first conversion capacitor and to a first terminal of the second conversion capacitor, and to selectively couple the second input to a second terminal of the first conversion capacitor and to a second terminal of the second conversion capacitor.

In view of all of the above, it is evident that a novel device and method is disclosed. Included, among other features, is forming a conversion circuit that adds the value of the differential signal to approximately half of a value of a reference signal to form a single ended signal. Forming the conversion circuit to be devoid of operation amplifiers and devoid of current sources reduces the size of the circuit thereby reducing the costs.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A conversion circuit for a phase looked loop comprising:

a first signal input configured to receive a first portion of a differential signal from a differential loop filter, and a second signal input configured to receive a second portion of the differential signal from the differential loop filter;

a power supply input;

a common return input;

a first capacitor having a first terminal coupled to a common mode node, the first capacitor having a second terminal;

a second capacitor having a first terminal coupled to the common mode node, the second capacitor having a second terminal;

a first switch having a first terminal coupled to the first signal input and having a second terminal coupled to the second terminal of the first capacitor;

a second switch having a first terminal coupled to the first signal input and having a second terminal coupled to the second terminal of the second capacitor;

a third switch having a first terminal coupled to the second signal input and having a second terminal coupled to the common mode node;

a fourth switch having a first terminal coupled to the power supply input and having a second terminal coupled to the second terminal of the first capacitor;

a fifth switch having a first terminal coupled to the common return input and having a second switch coupled to the second terminal of the second capacitor;

a sixth switch having a first terminal coupled to the common mode node and a second terminal coupled to an output node of the conversion circuit; and a control circuit configured to enable the first switch the second switch and the third switch substantially simultaneously and configured to disable the first switch, the second switch, and the third switch substantially simultaneously, the control circuit configured to enable the fourth switch, the fifth switch, a and the sixth switch substantially simultaneously and to disable the fourth switch, the fifth switch, and the sixth switch substantially simultaneously wherein the control circuit enables the fourth switch, the fifth switch, and the sixth switch in a substantially non-overlapping manner relative to enablement of the first switch, the second switch, and the third switch.

2. The conversion circuit of claim 1 further including an output capacitor coupled between the output node and the common return input.

3. The conversion circuit of claim 1 further including a buffer circuit coupled between the output node and an output of the conversion circuit.

4. The conversion circuit of claim 3 wherein the buffer circuit has an input coupled to the output node to receive a signal formed at the output node, and has an output coupled to the output of the conversion circuit.

5. The conversion circuit of claim 3 wherein the buffer circuit includes a transistor having a control electrode coupled to the output node, and a first current carrying electrode coupled to the output of the conversion circuit.

6. The conversion circuit of claim 1 wherein the conversion circuit is devoid of an operational amplifier.

7. The conversion circuit of claim 1 wherein the conversion circuit is devoid of a current source.

8. A method of forming a conversion circuit for a phase lock loop comprising:

forming a first input and a second input to receive a differential signal from a differential loop filter;

forming a first conversion capacitor coupled to a second conversion capacitor;

configuring the conversion circuit to selectively charge the first conversion capacitor and the second conversion capacitor to a value of the differential signal; and configuring the conversion circuit to thereafter selectively couple the first conversion capacitor and the second conversion capacitor in series, and selectively couple a reference voltage in parallel therewith.

9. The method of claim 8 wherein forming the first conversion capacitor coupled to the second conversion capacitor includes commonly coupling the first conversion capacitor and the second conversion capacitor to a conversion node.

10. The method of claim 9 including commonly coupling a first terminal of the first conversion capacitor to the conversion node, and coupling a first terminal of the second conversion capacitor to the conversion node.

11. The method of claim 8 wherein configuring the conversion circuit to selectively charge the first conversion capacitor and the second conversion capacitor includes configuring the conversion circuit to selectively couple the first conversion capacitor and the second conversion capacitor in parallel with the differential signal.

12. The method of claim 8 wherein configuring the conversion circuit to selectively charge the first conversion capacitor and the second conversion capacitor includes configuring the conversion circuit to selectively couple the first input to a first terminal of the first conversion capacitor and to a first terminal of the second conversion capacitor, and to selectively couple the second input to a second terminal of the first conversion capacitor and to a second terminal of the second conversion capacitor.

13. The method of claim 8 wherein configuring the conversion circuit to thereafter selectively couple the first conversion capacitor and the second conversion capacitor in series includes configuring the conversion circuit to selectively couple a power supply voltage in parallel therewith.

14. The method of claim 8 wherein configuring the conversion circuit to thereafter selectively couple the first conversion capacitor and the second conversion capacitor in series includes coupling a first terminal of the first conversion capacitor to a first terminal of the second conversion capacitor, selectively coupling the reference voltage to a second terminal of the first conversion capacitor, and selectively coupling a second terminal of the second conversion capacitor to a common return of the reference voltage.

15. The method of claim 8 further including coupling a first switch between the first input and a conversion node that is commonly coupled to a first terminal of the first conversion capacitor and a first terminal of the second conversion capacitor.

16. The method of claim 15 further including coupling a second switch between the second input and a second terminal of the first conversion capacitor, and coupling a third switch between the second input and a second terminal of the second conversion capacitor.

17. The method of claim 16 further including coupling a fourth switch between the conversion node and an output of the conversion circuit.

18. The method of claim 17 including coupling the fourth switch between the conversion node and a first terminal of an output.

19. The method of claim 17 further including coupling a fifth switch between the second terminal of the first conversion capacitor and the reference voltage.

20. A method of forming a conversion circuit for converting a differential signal to a single ended signal for a phase locked loop comprising:

providing inputs to receive a differential signal from a differential loop filter;

configuring the conversion circuit to store a value of the differential signal to form a stored signal; and configuring the conversion circuit to add a fraction of a value of a reference signal to the stored signal to form a single ended output signal.

* * * * *

UNITED STATES PATENT AND TRADEMARK OFFICE
CERTIFICATE OF CORRECTION

PATENT NO. : 10,333,529 B1
APPLICATION NO. : 16/111880
DATED : June 25, 2019
INVENTOR(S) : Masayuki Kanematsu Page 1 of 1

It is certified that error appears in the above-identified patent and that said Letters Patent is hereby corrected as shown below:

In the Claims

In Column 10, Line 6, delete "looked" and add -- lock --;
In Column 10, Line 33, delete "switch" and add -- terminal --; and
In Column 10, Line 44, delete "a".

Signed and Sealed this
Thirtieth Day of July, 2019

Andrei Iancu
*Director of the United States Patent and Trademark Office*